(12) United States Patent
Mays, Jr. et al.

(10) Patent No.: US 6,229,503 B1
(45) Date of Patent: May 8, 2001

(54) MINIATURE PERSONAL DISPLAY

(76) Inventors: Robert Mays, Jr., 5801 Lowell, NE. #23b, Albuquerque, NM (US) 87111; Charles E. Crist, 1903 Alexander Dr., Waxahachie, TX (US) 75165-1907

( * ) Notice: Subject to any disclaimer, the term of this patent is extended or adjusted under 35 U.S.C. 154(b) by 0 days.

(21) Appl. No.: 09/139,372

(22) Filed: Aug. 25, 1998

(51) Int. Cl.[7] .............. G09G 5/00; G02B 27/14
(52) U.S. Cl. ................. 345/7; 345/8; 359/630
(58) Field of Search ............... 345/7–9; 359/630

(56) References Cited

U.S. PATENT DOCUMENTS

| | | | |
|---|---|---|---|
| 5,008,890 | 4/1991 | McFarlane | 372/41 |
| 5,245,623 * | 9/1993 | McFarlane | 372/69 |
| 5,324,386 * | 6/1994 | Jewell et al. | 372/50 |
| 5,369,415 * | 11/1994 | Richard et al. | 345/7 |
| 5,467,104 * | 11/1995 | Furness, III et al. | 345/8 |
| 5,596,339 * | 1/1997 | Furness, III et al. | 345/8 |
| 5,659,327 * | 8/1997 | Furness, III et al. | 345/8 |
| 6,008,781 * | 12/1999 | Furness, III et al. | 345/8 |
| 6,083,767 * | 7/2000 | Tjaden et al. | 438/20 |

* cited by examiner

Primary Examiner—Matthew Luu
Assistant Examiner—Anthony J. Blackman
(74) Attorney, Agent, or Firm—Duke W. Yee; Stephen J. Walder

(57) ABSTRACT

A personal display device miniaturized to allow the projection of images directly on the viewer's retina which is a compact and versatile device that further minimizes the potential for total immersion. The display device can be selected for use in the monitor mode or full video and full color or monochrome operation. The invention utilizes miniaturized 2D laser arrays integrated with nonlinear optical processes combining semiconductor technology with optics technology.

37 Claims, 9 Drawing Sheets

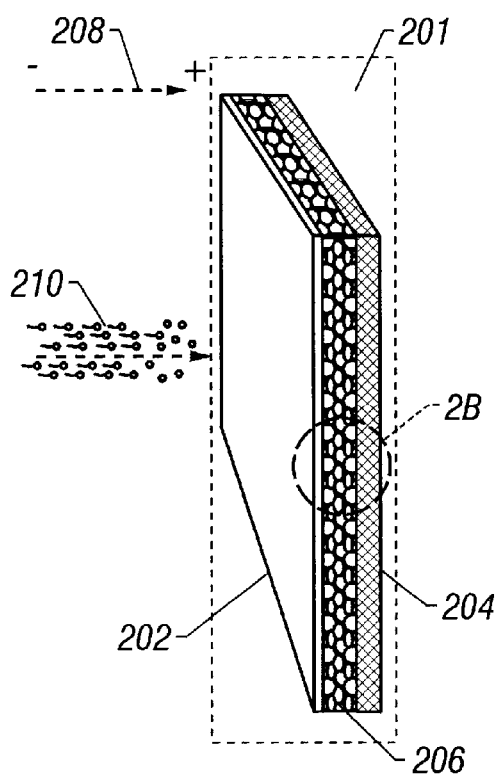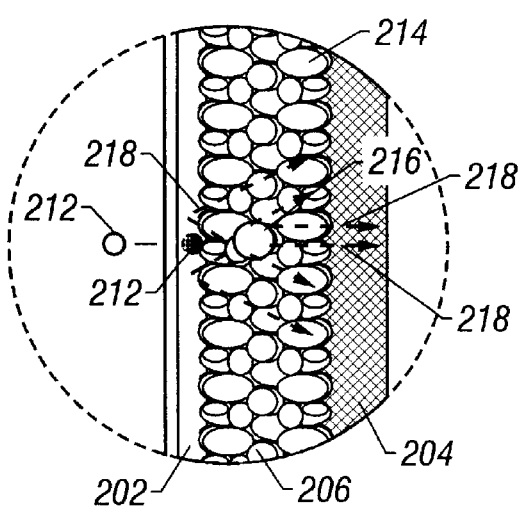
FIG. 2A
(PRIOR ART)
FIG. 2B
(PRIOR ART)

MINIATURE PERSONAL DISPLAY

BACKGROUND OF THE INVENTION

1. Technical Field

The present invention relates generally to a visual display device or method. More particularly, the present invention relates to a personal display device or method that projects an image onto the retina.

2. Description of the Related Art

Visual display devices which present scene and/or data information are not new and have been readily available to the general public since the invention of the television in the mid-twentieth century. Display devices are available for a broad spectrum of applications, from big screen televisions projecting entertainment media, to computer screens projecting information and display generated by a personal computer, to display devices providing positional and systems data to aircraft pilots. Today, visual displays are often the most vital link between man and machine. Personal displays are display devices designed to be viewed by a single viewer, such as Heads-Up Displays (HUDs) in aircraft applications. Such personal displays have only begun to reach maturity, and general availability and usage by a relatively small segment of the general public, within recent years.

FIG. 1 shows a typical display operations sequence of the more common types of display technology, including televisions and computer monitors. A beam source 102, typically electron guns, small accelerators, or similar devices, generates a charged particle beam 109. The charged particle beam is directed into a beam deflection and control system 104. The result is an incident beam 110 which is directed toward an optic screen 106. The incident beam 110 causes the optic screen 106 to direct an image beam 112 into the viewer's eye 108, ultimately projecting an image 114 onto the viewer's retina 116.

FIGS. 2a and 2b show further detail of an optic screen 201 in a typical prior art embodiment. FIG. 2 illustrates a perspective view if a cross-section of the optic screen 201. FIG. 2a is an enlarged cross-sectional view of the cut away edge of the optic screen 201. As described previously, the incident beam 210 is shown directed toward the optic screen 201. Since the 1940s, the incident beam 210 has usually comprised charged particles 212, such as electrons or ions accelerated by a voltage 208. The optic screen 201 is comprised of a first layer 202 which contains a visible light emitting material, a second layer 206 which contains optical material such as phosphors, and a third layer 204 of visible light transparent material. The first layer 202 is transparent to the charged particles 212. Therefore, the charged particles 212 pass through layer 202 and into the second layer 206. There, the charged particle 212 causes an event 216 in which the optical material 214 contained in the second layer 206 emits visible light 218. The first layer 202 is opaque to visible light 218, but the third layer 204 is transparent to visible light 218. Therefore, visible light 218 either travels directly through the third layer 204 or is first reflected from the first layer 202, and then travels through the third layer 204. Upon leaving the optic screen 201, visible light 218 becomes part of the image beam 112 shown in FIG. 1.

The process of fabricating typical display systems with the technologies and/or excitation (incident charged beams) as illustrated in FIGS. 1, 2a and 2b is well known and developed. The methods of using charged beams and materials such as phosphors for achieving visible light, light that can be perceived and used by humans, is also a well established and well understood field of science and technology.

Since the introduction of personal displays, a major effort has been made in industry to reduce the size of visual display devices for applications in a wide variety of fields. As personal display devices become more compact, they become more portable, take up less space when integrated with other display devices, such as in an aircraft cockpit, and weigh less. Some advancements have been made in reducing the size and weight of, for example, portable computer screens, personal television monitors, and numerous other video applications.

Another goal driving the further miniaturization of personal display devices involves attempts to minimize the problem of "total immersion" when a viewer is receiving images from the device. Total immersion is the phenomenon that naturally occurs when a viewer directs his attention to a video output. For example, although there are presently available television monitors in very small formats, such as two inch diameter screens, a viewer must focus his full attention on this small screen in order to have the images projected through his eyes and on to his retina. The viewer, therefore, becomes totally immersed in the task of obtaining information from this personal display device. By way of example, it would be rather hazardous for a viewer to attempt to obtain continuous information from the example television screen while also operating a motor vehicle in traffic. However, if the personal display device could be sufficiently miniaturized so that a small visual beam is directed onto the viewer's retina with a minimally distractive profile of the device itself, the viewer could monitor this information more passively while retaining the ability to see the real world and function accordingly. Such a device would allow a viewer to take in information from both a virtual reality image projected onto his retina and real world images while quickly transitioning between the two images or simultaneously extracting information from both.

The beneficial applications of a personal display device miniaturized to the extent that it is highly portable, interferes minimally with normal vision, and limits the phenomena of total immersion are quite extensive. Miniaturization of display information for an aircraft pilot would allow the pilot to monitor such information without substantially degrading the pilot's ability to monitor other items in the cockpit or conduct visual scans outside the aircraft. A discreet and constantly available monitor for portable personal computers would free up workers to perform manual tasks while obtaining information from the computer. Entertainment applications might include video games mixing virtual reality images with real viewer action. A security officer could monitor video from surveillance cameras while also conducting a visual inspection of other areas assigned to his care. Rather than using overhead projectors or other video equipment, a lecturer could be viewed directly while supporting visual images (teaching aids) are beamed discretely onto the retina of the viewer. A surgeon could monitor the output of miniature optics while simultaneously focusing his attention on other areas on the patient. Despite the numerous potential applications for such miniaturized personal display devices, however, industry has yet to produce such a device that is sufficiently small and inexpensive to manufacture as to be available to the general public in a variety of applications.

Attempts have been made to easily implement a relatively small device capable of operating at the user's discretion in full video type operation, in monitor type operation, in full color, or in monochrome. Such attempts have not been successful as no relatively small device capable of operating at the user's discretion in full video type operation, in monitor type operation, in full color, or in monochrome is currently available. This cannot as yet be achieved with liquid crystal display (LCD) technology or electro-luminescent display (ELD) technology; and plasma display (PD) and cathode ray tubes (CRT) technologies cannot be made small enough. Other potential technologies that have offered more promise by theoretically providing adequate brightness with low power requirements are the use of lasers and light emitting diodes (LEDs). With LEDs, there are more than three decades-old questions of whether or not enough power can be achieved and whether or not the spread of the optical beams can be made small enough to use it in miniaturized applications. So far, there has been very little success or progress with either of these issues so that most, if not all, efforts of any interest have centered around the use of laser emission structures.

There have been several approaches to using lasers and laser diodes for small display applications in the past, but none of them have been successful in producing a miniature personal display device capable of mass production. One of the more frequently suggested and explored concepts is to use laser diodes or LEDs that are singular in color in operation, but mounted or packaged in a two dimensional array. This approach, however, presents multiple problems. Laser diodes and LEDs are single colored or very nearly monochromatic in output because of the materials used to fabricate them. Thus, red devices are of one material/composition, green devices are of another, and blue are yet of another. Putting single devices together in a two dimensional array is called "tiling" and sometimes referred to as mosaic processing. Tiling necessarily adds to the dimensions and complexity of the device. A typical display would have a resolution of at least 640×480 elements (m×n), which means that more than 300,000 elements would have to be "tiled" together for monochrome operation or 900,000 for full color operation.

Another approach to solving the display problem using laser technology is to use one to three single color lasers in the format of a display device scheme as similarly illustrated in FIG. 1. In this case, a single laser beam with a single color (red, blue, or green) is scanned and focused onto the retina of the eye. If full color operation is desired and/or required, then three lasers would have to be used which then greatly impacts all other parameters of the system in terms of both complexity and mechanical capability. This type of approach has been referred to as the Virtual Retinal Display (VRD), but as yet has not met commercial success. Therefore, a need exists for a relatively small personal display device capable of operating at the user's discretion in full video type operation, in monitor type operation, in full color, or in monochrome. This device needs to require little power to operate, be functional in a variety of diverse applications, and be capable of mass production.

Attempts have also been made to prolong the useful life of light emitting materials used in display systems. Among the deleterious or destructive effects observed with the use of charged particles, such as electrons or ions in bombarding light emitting materials, is a process generally referred to as "aging." This process results in a visibly noticeable reduction in the operational lifetimes of the light materials via decreases in brightness outputs and visual clarity. A need also exists for a display system that suffers less from aging. Any miniaturized personal display that would also reduce aging problems would be of further commercial benefit.

SUMMARY OF THE INVENTION

The present invention relates to a miniature personal display device or method that produces light emitting spots directed onto a viewer's retina. The light emitting spots are produced by microns-sized diodes/lasers pumping phosphors located above the diodes/lasers. The individual spots of light used to make an image can all be of the same color (monochromatic) or of different colors. In the multiple color operation, the present invention uses a single or monochromatic pump source rather than discrete diode/laser sources of different colors. The lasers used in the present invention are fabricated in a two dimensional ("2D") array format with established semiconductor processing techniques and practices. The 2D laser arrays are then integrated with nonlinear optical processes such as up-conversion (anti-Stokes process) in order to obtain multiple color outputs.

Using photons with nonlinear up-conversion materials to obtain visible light output from a display device 314 (such as illustrated in FIGS. 3a and 3b) provides an advantage toward miniaturization of the present invention. Using miniature (microns-sized) light emitting structures, such as surface emitting laser diodes, further allows for the miniaturization of the entire system concept illustrated in FIG. 1 to a much smaller system or package 416 as illustrated in FIG. 4. The present invention uses two-dimensional arrays (m×n), of light emitting elements (photons), to miniaturize the display system to the generic manifestation illustrated in FIG. 4. Miniaturization is also complemented through components and materials integrations in such areas as the use and integration of micro-lens array technology and the integration of the up-conversion (phosphor) materials directly onto the surfaces of the optics themselves.

In addition, the invention's bombardment of light emitting materials or the insertion of photons into these materials does not have the same deleterious or destructive effects as observed with charged particles such as electrons or ions. The lifetimes that can be achieved through the invention's use of low power photons, rather than charged particles, can result in light emitting material lifetimes that are an order of magnitude or more beyond those of their counterparts in the electrons or ions arena.

The present invention provides full video-type operation and/or monitor type operation (at the viewer's preference) in a compact system, and the ability do either operational mode in a monochrome or full-color format. This is possible because of the use of semiconductor microns-sized laser diodes and, in particular, the ability to easily and effectively fabricate and operate them in a two-dimensional format such as illustrated herein. The present invention uses arrays (m×n) of single color (infrared) microns-sized laser diodes known as Vertical Cavity Surface Emitting Lasers (VCSELs) that are fabricated via well known semiconductor device processes. Arrays can be sized from one device count to well into the thousands and up depending upon the mask sets and other features.

Because of the size and other design characteristics of the present invention, the system can be used in such a manner as to avoid the negative aspects of operating in the "total immersion" mode that is often associated with the virtual reality field. An application such as illustrated in FIGS. 3a and 3b allows the user to see the display/information while retaining his ability to still see the real-world and function accordingly. In other words, the invention is entirely capable of operating in an almost "see through" mode and not blocking the real-world information being used by the operator.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 2a and 2b are perspective views of a cross section of an optics screen;

DETAILED DESCRIPTION

Figure 1:
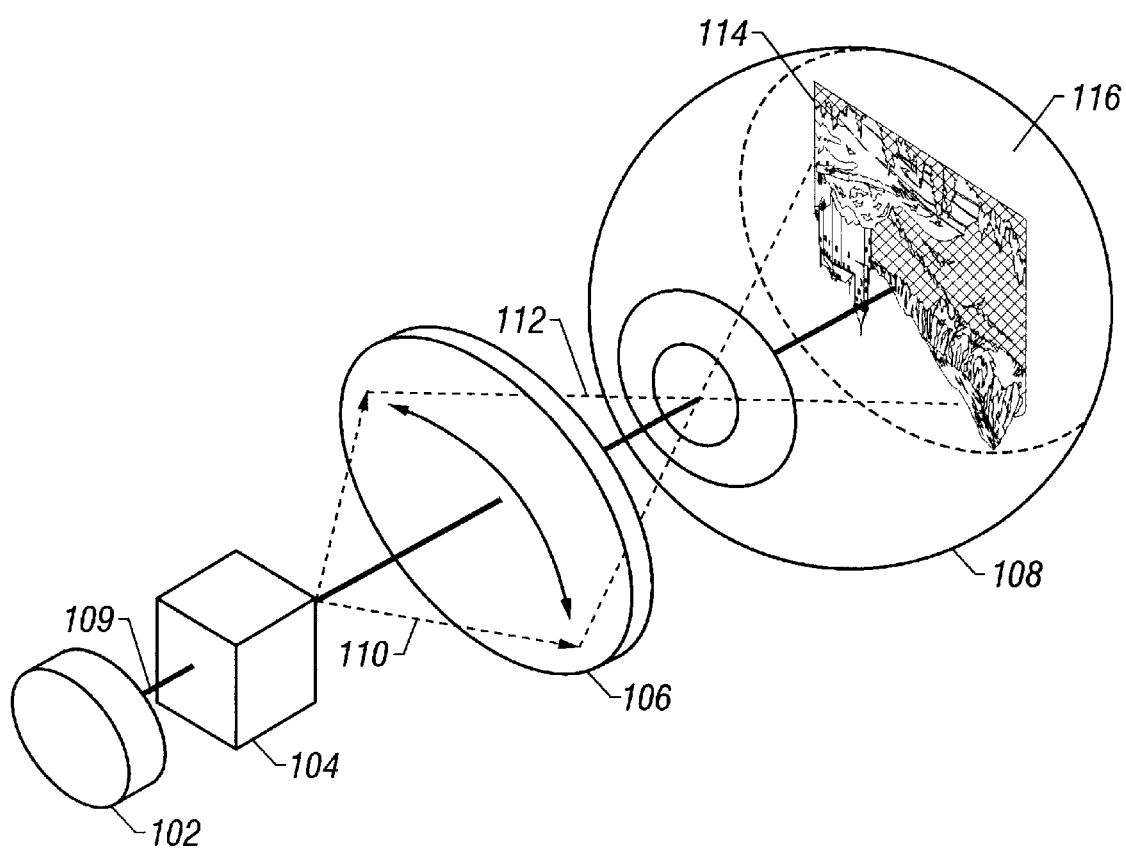
FIG. 1 is a schematic of one implementation of typical prior art display technology.
Figure 3B:
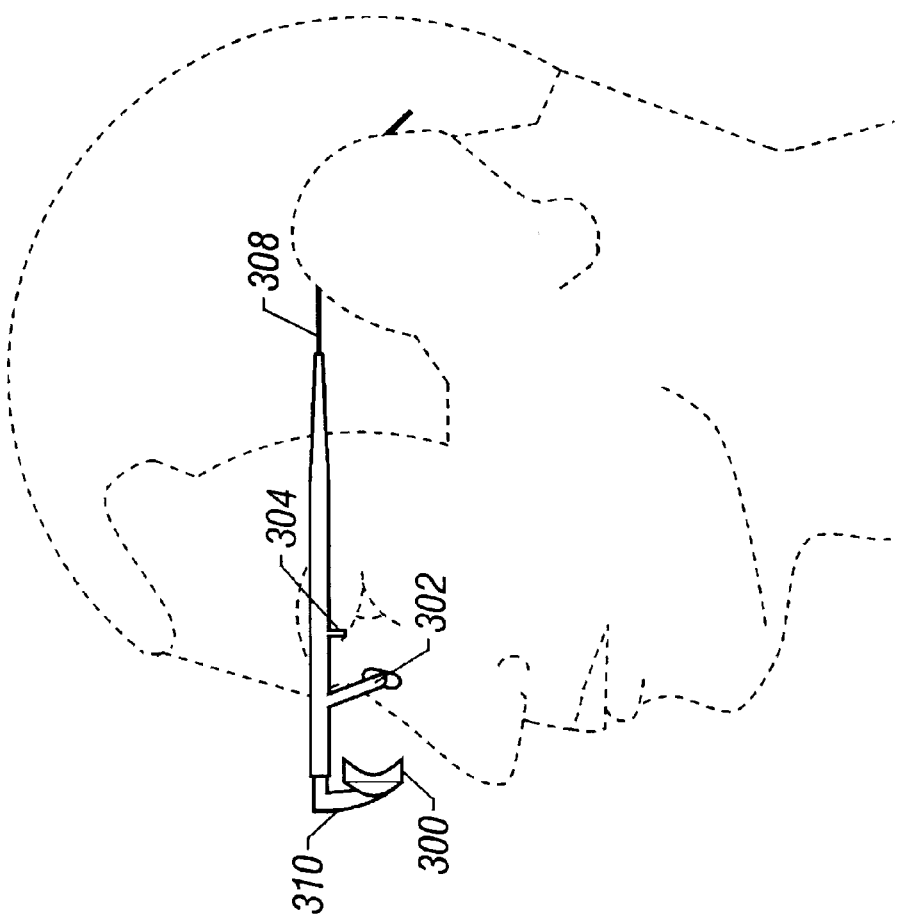
FIGS. 3a and 3b are pictorial representations of an embodiment of the invention.
Figure 3A:
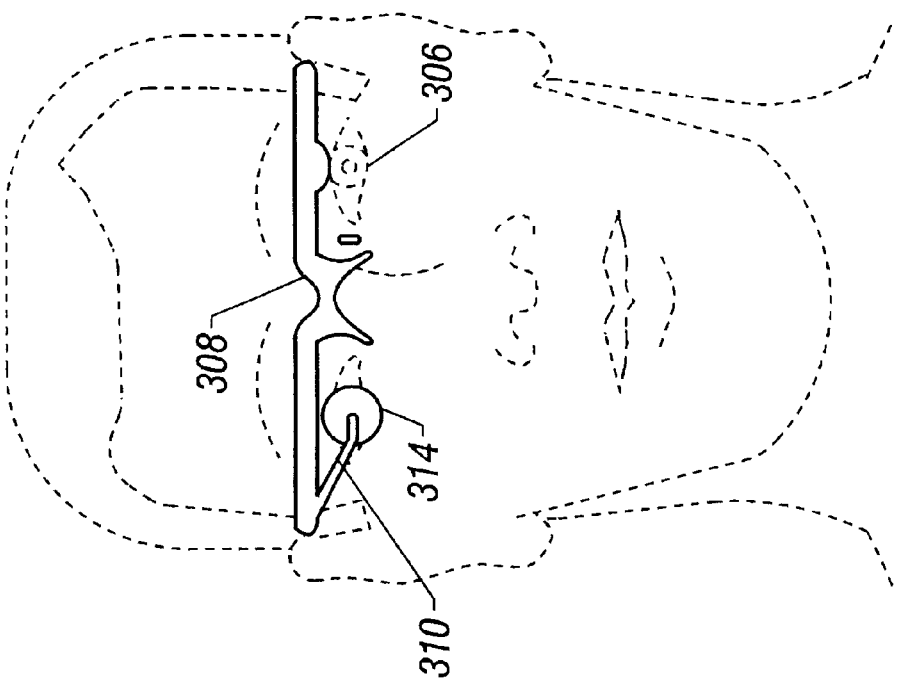

This disclosure describes the development, state-of-the-art technology, state-of-the-art technology integration, technology breakthroughs, and emerging research and development in these areas, to a miniature display that can be mass produced and utilized by individuals on a personal basis as, for example, illustrated in FIGS. 3a and 3b. FIGS. 3a and 3b show only one embodiment of how the miniature personal display 314 of the present invention may be configured or applied. In the embodiment illustrated by FIGS. 3a and 3b, the miniature personal display 314 is attached to a carrier device 308 resembling eyeglasses by means of a connecting bar 310. The miniature personal display 314 consists of an integrated electronics beam source and control component 300 and an integrated optics and phosphors component 302. Although illustrated as physically separated, one embodiment of this invention compresses all components 300, 302 into one integrated package. The miniature personal display 314 projects an image onto the retina of one of the viewer's eyes 304. The viewer's other eye 306 is unobscured and remains free to view other images, such as the surrounding environment. The same carrier device 308 could mount on additional miniature personal display 314 oriented to the viewer's other eye 306 to provide binocular images as well. Further, while the miniature personal display 314 is shown oriented in front of the viewer's eye, the use of optics etched with collimation grating (as will be discussed further below) can allow for the personal display 314 to be offset from the eye. Such offset embodiment minimizes the profile of the personal display and allows the viewer to easily refocus or "look around" the device in order to view his external environment.

Figure 4:
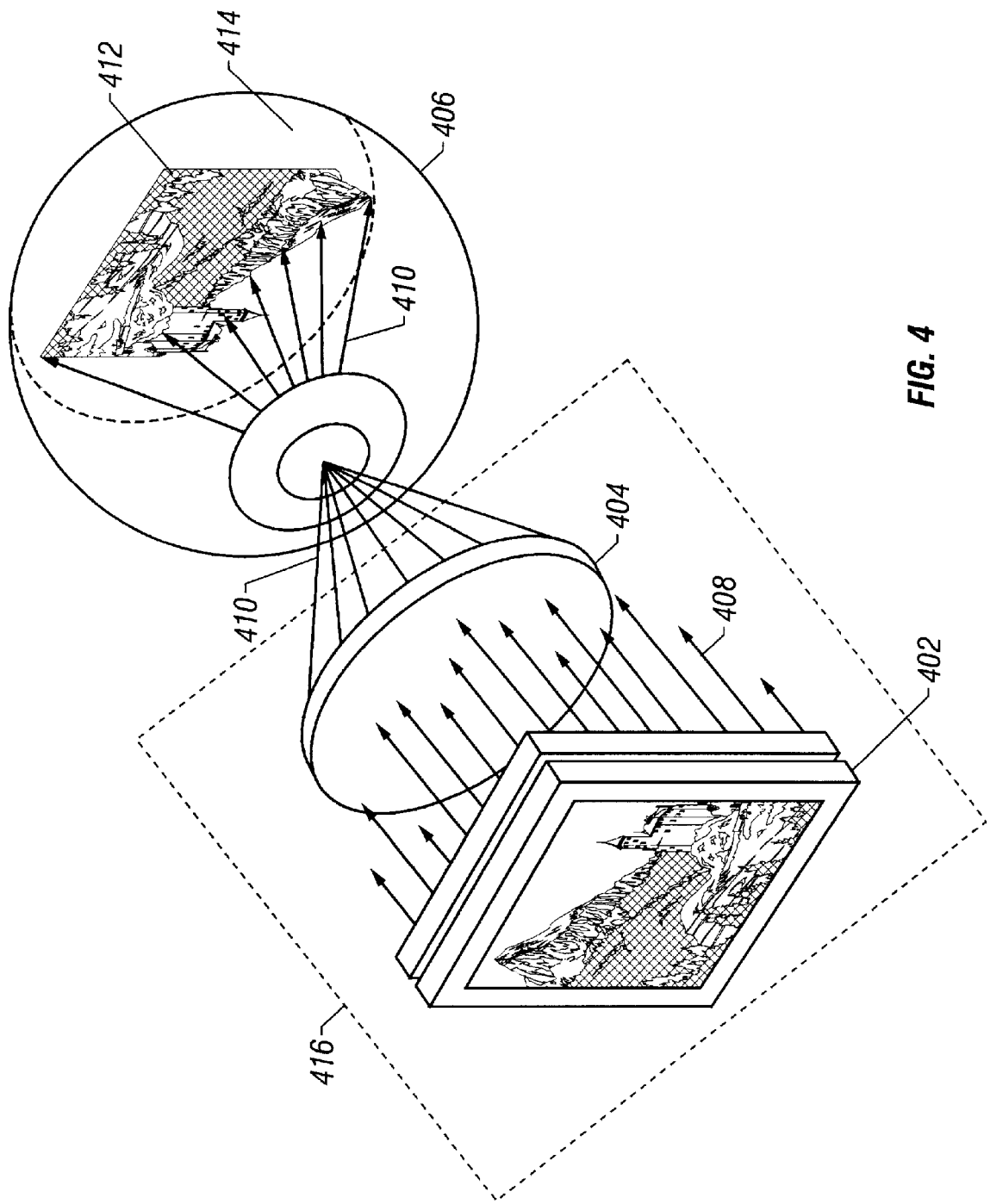
FIG. 4 is a schematic of an integrated embodiment of the invention.

FIG. 4 shows a simplified schematic illustration of the implementation of an embodiment of this invention. The components of the display device 416 are all integrated together, but are discussed separately as two component groups for clarity. The integrated electronics, beam source, and control element 402 determines, produces, and directs photon beams 408 to the integrated optics and phosphors element 404. The integrated optics and phosphors 404 respond by directing visible light beams 410 into the viewer's eye 406. The visible light beams 410 create an image 412 on the viewer's retina 414.

Figure 5:
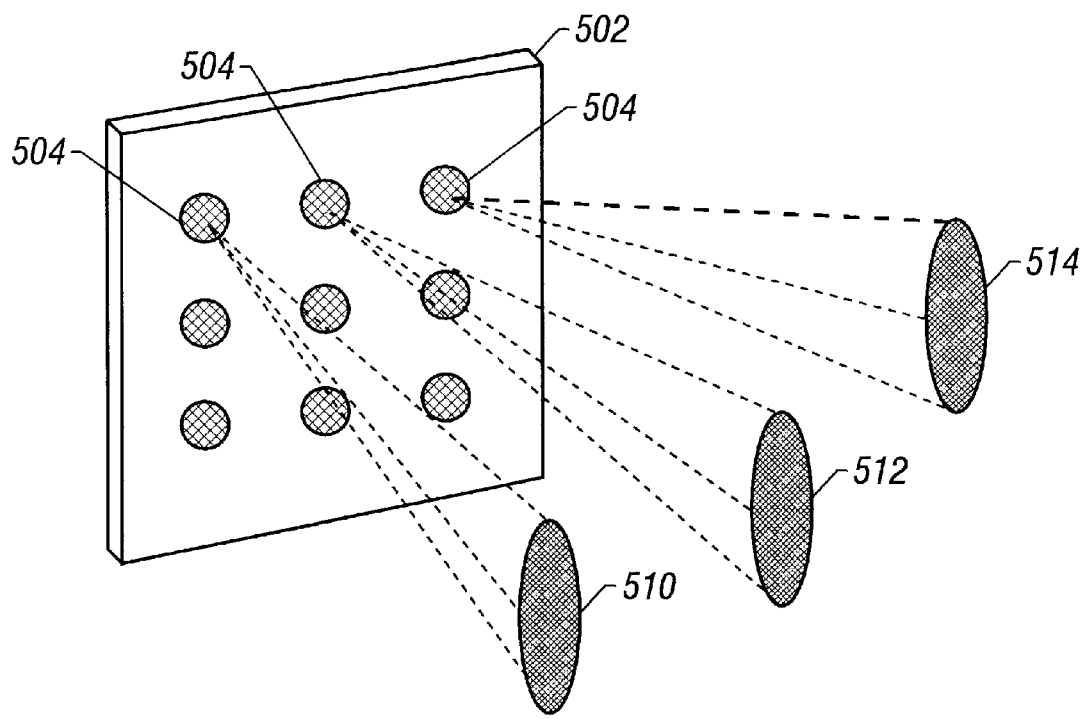
FIG. 5 is a schematic representation of the results of light emitters directed at nonlinear optical phosphorus.

FIG. 5 illustrates what is being imaged onto the retina of a human eye when looked at from the observer-display orientations of FIGS. 3a, 3b and 4. FIG. 5 illustrates the results of the use of a two-dimensional (m×n) array 502 of light emitters (not shown) which in turn emit infrared photon radiation into nonlinear optical phosphors 504. Thereby, visible light is emitted of different colors, red 510, green 512, and blue 514, which is imaged onto the retina. In the embodiment illustrated in FIG. 5, the individual emitters within the (m×n) array 502 are microns-sized laser diodes that are designated to emit infrared radiation at a specific wavelength.

The wavelength of the infrared emission from the laser diodes falls within a specific absorption band of the particular nonlinear phosphor material 504 that is immediately above it. The nonlinear phosphor material can either be in direct contact with the micro-optical element or it can be in direct contact with the top surface of the laser diode emitter itself. Alternatively, all of the elements (lens, phosphor material, and laser diode emitter) can be in intimate contact as is commonly found in lens immersion schemes in optical and electron microscopy.

In the display mode illustrated in FIG. 5, each laser diode, phosphor, and lens element 504 can be operated independently, in serial fashion, or in parallel fashion. They can also be operated either in a line or column fashion. Each element, line, or column can be randomly addressed at either monitor or full-video rates.

Figure 6:
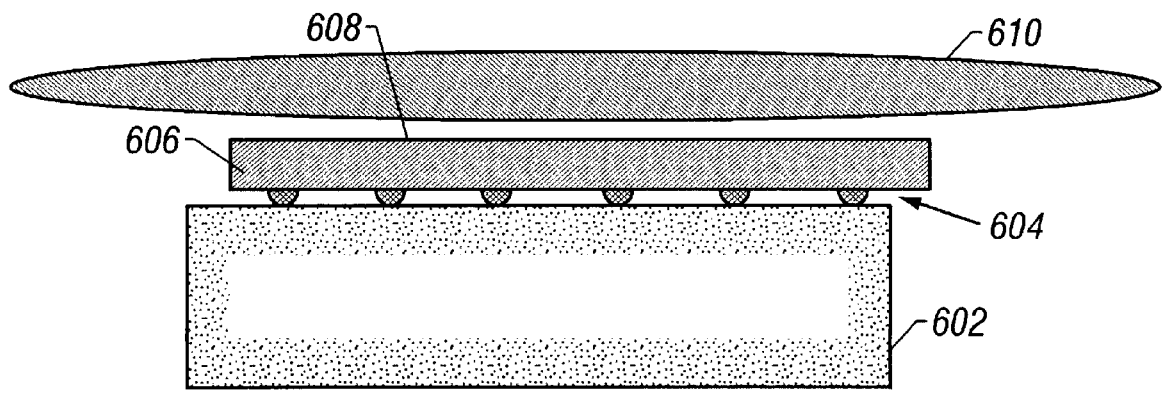
FIG. 6 is a schematic side view illustration of the basic components of one embodiment of the invention.

The invention's method (system elements diagram) of achieving the operation of FIG. 5 is illustrated in FIG. 6. FIG. 6 is a system elements diagram for one embodiment of the present invention shown schematically in a side view. The main elements are the optics element 610, the phosphor element 608, the (m×n) laser diodes emitters array 606, and the connection mechanism 604 between the (m×n) emitters array 606 and the (m×n) drive electronics 602. The drive electronics 602 are applications specific integrated semiconductor circuitry and are also referred to herein as a semiconductor package. More detail for each of these system elements is illustrated in FIGS. 7a, 7b, 8, 9a, 9b, 10, 11a, 11b, 11c, and 11d.

Figure 7A:
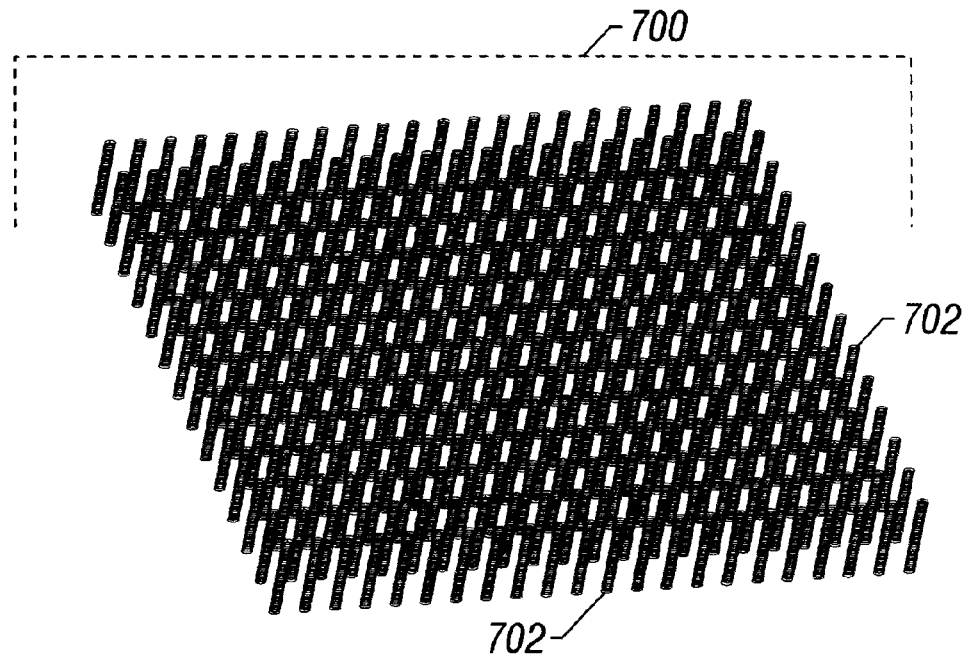
FIG. 7a is a perspective view of a two dimensional emitter array.
Figure 7B:
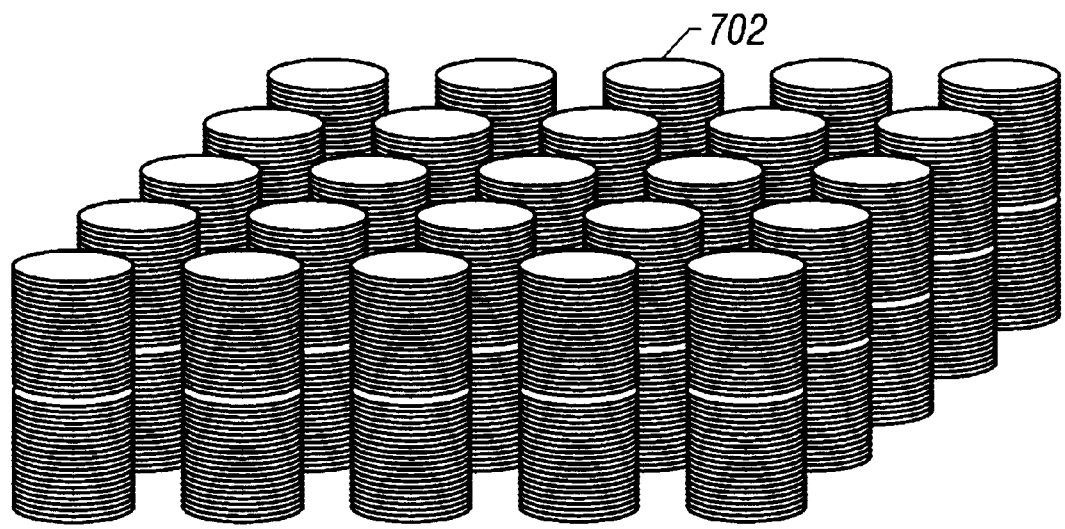
FIG. 7b is a perspective view of individual emitters in rows or columns.

FIG. 7a illustrates the two dimensional laser diodes array technology by showing an (m×n) array 700 of laser diode elements 702. FIG. 7b shows the individual laser diode elements 702 within a row or column of an (m×n) array. The individual diode elements 702 can be typically as small as 1–3 microns in diameter, with center-to-center spacings (pitch) as small as 2–3 microns, or larger. Sizes and pitches are determined by the fabrication masks and processes used and designed for an applications requirements set. Smaller diode sizes and pitches are entirely possible and have been accomplished, but the limit for use in the aforementioned display application is set by the resolution of the human eye-retina optics subsystem.

The diodes 702 and array 700 have backside electrical contacts 604 (as shown in FIG. 6) which allow for a greater (m×n) density as well as more compactness of the total emitter area. Contacts 604 are required to each diode 702 in the array to provide electrical (drive) stimulation to the optical emitting structure. These contacts 604 are described in more detail below in conjunction with FIG. 10.

The light emitting diodes 702 in FIGS. 7a and 7b have been designed to emit radiation in the near-infrared part of the electromagnetic spectrum. Light within the visible part of the spectrum (human eye response) is achieved by directing or injecting the infrared (non-visible) radiation from the emitter into a nonlinear phosphor material such as GaP:ZnO. This process is commonly referred to as the anti-Stokes or up-conversion process.

Figure 8:
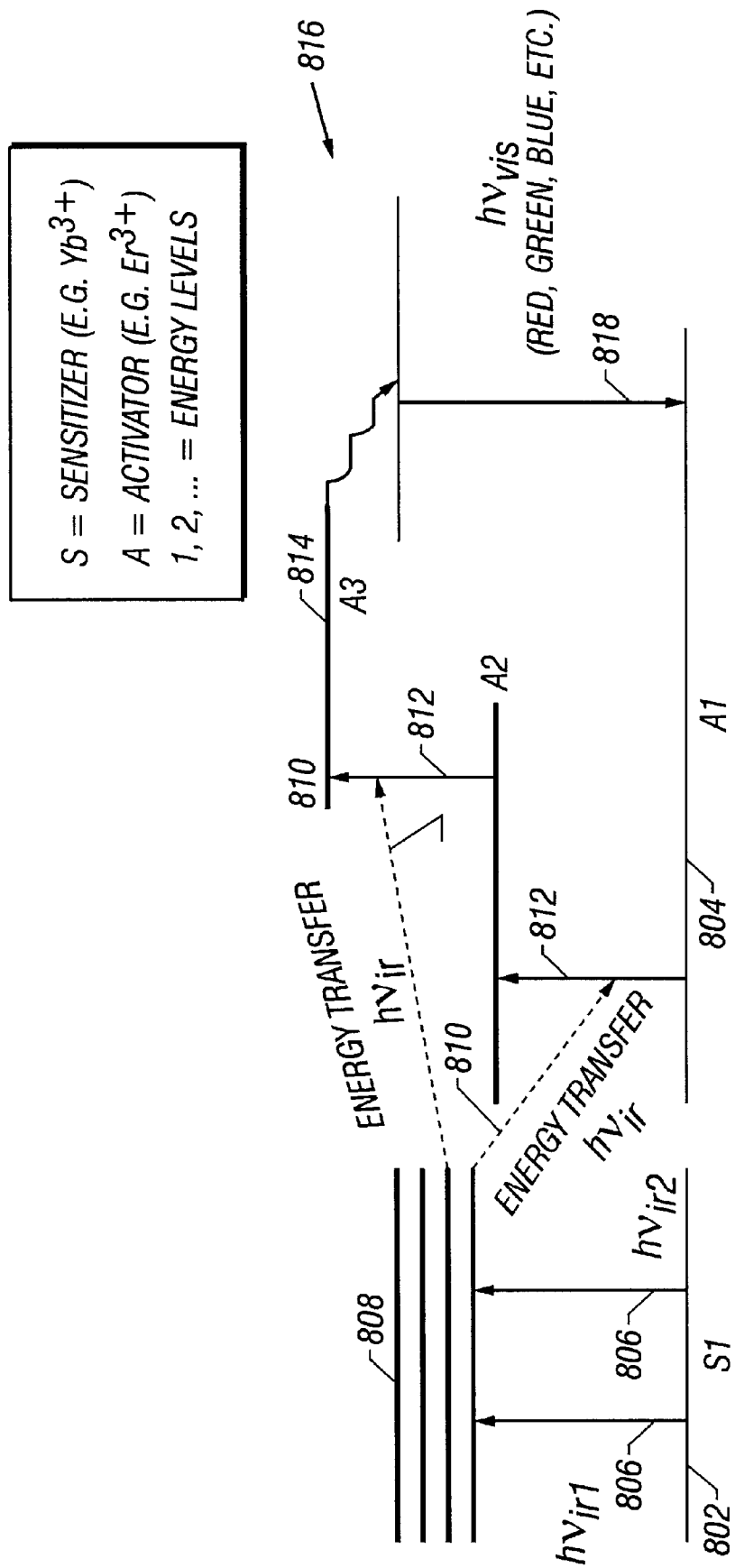
FIG. 8 is a graphic illustration of the up-conversion step process.

FIG. 8 is a graph showing the up-conversion step process or anti-Stokes process. The sensitizer and activator components of the up-conversion materials (phosphors) begin the process at initial energy levels 802, 804. In the process, multiple infrared (IR) photons 806 from a laser emitter are absorbed by the sensitizer which is incorporated within the phosphor material. The energy in one or more states of the upper band in the sensitizer 808 is charged by the photons 806. An energy transfer 810 occurs to cause an increase 812 of the activator from its initial energy level 804 to a heightened energy level 814. The energy within these states then decays in a definite multiple-step process 816, which results in the subsequent relaxation and emission process 818 (visible light) as shown.

The up-conversion step process or anti-Stokes process can often be as multi-stepped or complicated as one desires and/or as determined by the phosphor and laser (pump) sources themselves. One embodiment of the present invention uses diodes/lasers emitting an infrared (IR) wavelength of about 980 mn. This wavelength is not visible to the human eye. The IR output (wavelength) of the diode, however, impinges on, or is absorbed by, a phosphor which then through the anti-Stokes process finally emits visible photons (light).

Using the up-conversion process of the present invention, the color of light that is finally emitted is a function of both the material characteristics (energy states involved in absorption and emission) and the wavelength of the pump (laser) radiation. Embodiments of the present invention have been developed using numerous phosphors which emit either red, green or blue light. The invention has also been demonstrated using other types of phosphors that emit at wavelengths other than the visible for other applications, such as night vision devices. The anti-Stokes process and further general information regarding the use of phosphors in this regard can be found in F. E. Auzel, "Materials and Devices Using Double-Pumped Phosphors With Energy Transfer," Proc. Of IEEE, vol. 61 no. 6, June 1973.

Figure 9B:
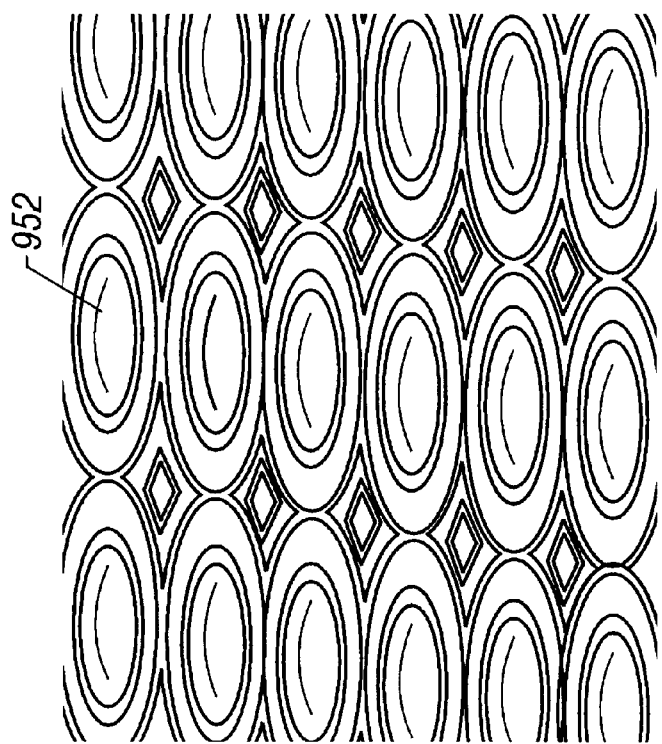
FIG. 9b is a pictorial representation of a micro-optics array of lenses.
Figure 9A:
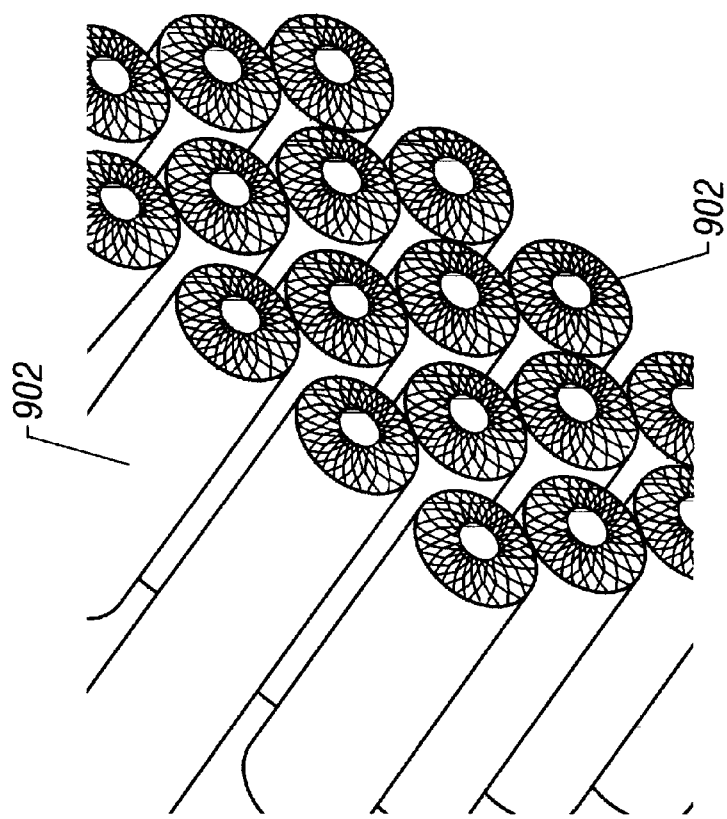
FIG. 9a is a pictorial representation of individual lens elements of arrays of micro-optics technology.

FIGS. 9a and 9b illustrate the type of micro-optics technology used in the instant invention. FIG. 9a illustrates the type of individual elements 902 that can comprise the (m×n) optical array. FIG. 9b illustrates the (m×n) optical element array 952 on a large scale. The individual optical elements 902 can be as small as to 0.5 microns in diameter typical, or as large as required with pitches (center-to-center distances) that can be made to match those of the underlying (m×n) diode emitter array. The individual optical elements 902 and the whole array 952 itself can be designed and fabricated as refractive, diffractive, or immersive. They can also be designed and fabricated to act as compound optical elements to provide the beam correction and control functions as desired for a given application. As mentioned previously, in one embodiment of the invention, the phosphor material is deposited directly onto each element 902 and the entire optics-phosphor system is brought into contact with the individual infrared emitter elements.

Figure 10:
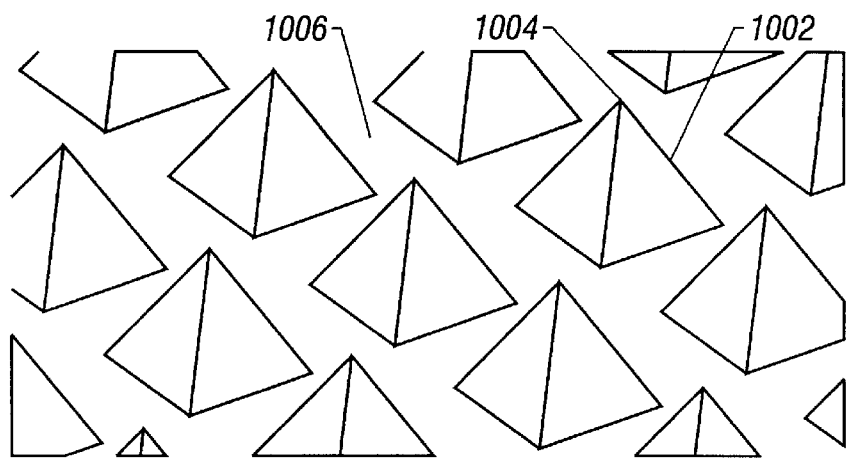
FIG. 10 is a schematic representation of an array of emitter to electronics contacts.

The emitter to electronics contacts element of one embodiment of the invention are illustrated in FIG. 10. The contacts 1002 are comprised of atomically sharp metallic points 1004 that are designed and fabricated with the appropriate (m×n) array count and pitch (format) to match and connect the integrated semiconductor drive electronics 1006 to the infrared diode emitters on a one-to-one basis. The drive electronics 1006 provides the voltages and currents necessary to power the infrared emitters, and also provide the proper control for random accessing individual diodes, lines of diodes, or columns of diodes, thus providing the proper display operations. The integrated semiconductor drive circuitry is designed and fabricated using common application specific integrated circuit (ASIC) technology.

The ability to design and fabricate atomically sharp points 1004 and integrate this with the electronics 1006 has been developed and demonstrated within the flat panel display (FPD) field within the past decade. This design scheme and technology are one of the basics for the Field Emitter Displays (FEDs) that are being developed within the FPD field. However, their use in a miniature personal display as disclosed in the present invention is the first time that this type of application for the sharp tips 1004 as emitter-electronics contacts has been used in such regard.

One advantage of the present invention is the use of lasers with a single IR wavelength that are routinely fabricated in 2D array formats using normal and established semiconductor processing techniques and practices. These 2D laser arrays are then integrated with other nonlinear optical process, such as the up-conversion process, in order to obtain multiple color outputs, including visible light.

The lasers/diodes arrays (m×n) utilized in the present invention can be fabricated in numbers ranging from 2×2 to 1,024×1,024 or more and virtually anything in between. Monochromatic 2D VCSELS can be fabricated with individual laser dimensions ranging from only 1 to 2 microns diameter to tens of microns diameter. Center-to-center spacing (pitch) between lasers can range from only a few microns to rather large distances. These are parameters that must be considered in the design of the present invention depending on the specific application desired.

The optics design issues and requirements of each embodiment of the present invention are directly determined by both the desired application and use of the display and the eye-system resolution combination. The present invention can be used in a monocular, binocular, or stereoscopic fashion, which means that one or two devices 314 illustrated in FIGS. 3a and 3b are contemplated. The operable mode is determined by the electronics and display to video rates capabilities thereof. The present invention can invoke any of these modes via the integrated processing capability of the ASICs that are incorporated in the system.

With more specific respect to the optics design issues, they are determined by the eye-system resolution requirements. In a typical case, the resolution for a 20/20 visual requirement is on the order of 1 to 2 arc minutes, which is used to determine the appropriate optics and/or optics elements designs. This factor is further dependent upon whether the display mode is monocular or binocular and upon other factors such as convergence and accommodation. Other considerations require an understanding of the resolution of the typical eye/retina, the maximum permissible exposure of light onto the eye/retina without damage, on the sizes of the light emitting elements and their spacing.

For example, one embodiment of the present invention uses an ordinary type of 2D VCSEL pump array comprised of 5 micron diameter elements on 10 micron center-to-center spacings. These two factors determine the physical size of the array itself and are used in further tradeoffs as to what image resolution and display capability is required. A determination is made as to what the viewer's eye requires to obtain VGA like resolution and then the optics are designed given the set pump array characteristics in order to make this happen. In general, a normal eye has a 2 mm pupil diameter for exposure to bright light near the center of the visible spectrum. The visible spectrum lies between 400 nm for blue and 700 nm for red with green in between at about 550 nm. The minimum angular separation required for the eye to resolve two points (light emitting spots) is on the order of 1.15 arc minutes. Therefore, for the normal eye to see or distinguish between two separate emitting spots, they must be separated in space by about 1.15 arc minutes. For an image source or personal display 314 mounted as in the embodiment illustrated in FIGS. 3a and 3b, this would require (for a normal eye) that the source spots be separated by around 12 to 15 microns or more to include all the colors. The optics are then designed to accomplish this without introducing blurring or astigmatisms and to provide a sharp and clear image.

This can be accomplished by using the optical principles associated with Fresnel optics, holographic optical elements, and/or combinations thereof. The present invention accomplishes this by using a multidimensional (2D) array of microns-sized optical elements that are matched to the 2D emitter array. This starts the process of beam/spot concentration and control and provides the basis or vehicle used for integrating the phosphors that produces the multiple visible colors. One embodiment of the present invention integrates the up-conversion phosphors directly onto the optical elements either through adhesion or on a thin film basis. This can be done on either an individual element, line, or column basis, or any combination thereof, using common lithographic or printing techniques. The optical elements themselves are fabricated using such semiconductor processes as thin film technology and lithography. Individual element sizes can be as small as 0.5 microns if desired.

In order to maintain beam quality and control as well as meeting the required resolution and image characteristics (defined by design criteria and application), however, the present invention also includes various design elements drawn from the Fresnel and/or holographic optic fields. The optics themselves are basically thin film elements combined, which means that a single optics element 610 illustrated in FIG. 6 is a compound lens structure comprised of divergent, collimating, and immersion elements as well as structured gratings. Further information regarding the nature or types and function of the technologies involved in the optics of the present invention can be found in such documents as the "Fresnel Lens Brochure" published by Fresnel Technologies, Inc. of Fort Worth, Tex., and in K. Sakamoto et al., "Real-time Three-dimensional Display Using a Holographic Optical Element," Proc. SPIE, #2577; K. Sakamoto et al., "Real-time 3-D Color Display Using a Holographic Optical Element," Proc. SPIE, #2652; and, K. Sakamoto, "New Approach to the real-time 3-D Display Using a Holographic Element," Proc. SPIE #3011 A.

Figure 11A:
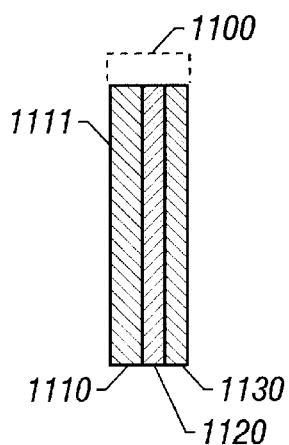
FIG. 11a is a schematic cutaway of an optic device of the present invention; and, FIGS. 11b, 11c, and 11d are schematic illustrations of three elements of an optics device of the present invention.
Figure 11B:
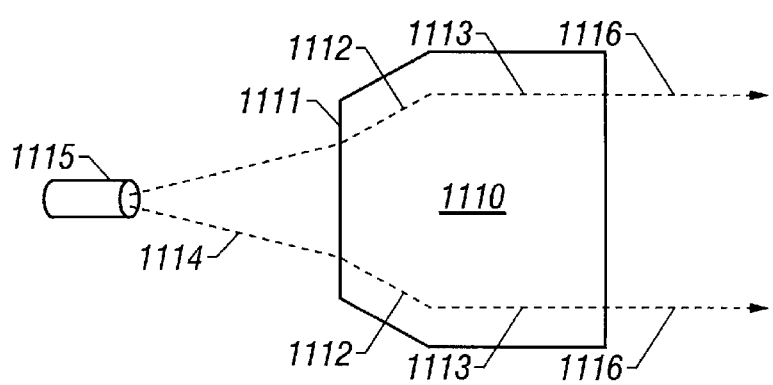
Figure 11C:
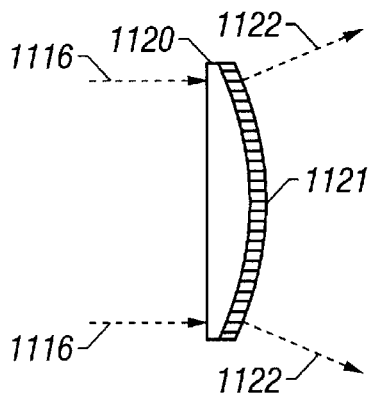
Figure 11D:
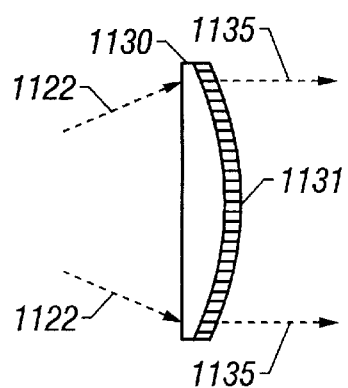

A multiple element optics embodiment of the present invention is illustrated in FIGS. 1a, 11b, 11c, and 11d. FIG. 11a shows a block representation cross section of three elements 1100, 1120, 1130 stacked together to form a single optics assembly 1100. FIG. 11b further shows the first element 1110 which could be an immersion type providing magnification 1112 of 2× or more and collimation 1113 of light 1114 from the diode 1115. The resultant light 1116 is then directed to the second element 1120. The second element 1120, which is shown by FIG. 11c, could be a Fresnel or holographic type dispersive with contoured grating 1121 or other appropriate structure on its back side and provides further expansion 1122 to 2× or more, and/or no loss of image/spatial information, to the image 1116 received from the first element 1110. The expanded image 1122 is next directed to the third element 1130. The third element 1130, which is illustrated by FIG. 11d, is a Fresnel/holographic structured type to provide final collimation 1135 for input to the lens of the eye. The grating 1131 is again shown on the backside of the lens 1130. The collimation 1135 can be designed, depending on the surface structures/grating 1131 used, to direct the resulting beam in any direction desired. Consequently, the display device 314 of FIGS. 3a and 3b need not necessarily be oriented head-on.

The gratings required on each lens element of FIGS. 11a, 11b, 11c, and 11d can be contoured and fabricated onto each individual element's surface using laser interference technique. All elements are thin or thick film (1–100 microns thick) and fabricated one layer at a time. Each element is exposed and etched one layer at a time, and stacked or integrated (i.e., a single structure with multiple layers where each layer is an element) as shown by FIG. 11a. Phosphor is mounted on the first optic side 1111 closest to the laser diode 1115.

The eye resolution discussed above (1.15 arc minutes) would translate into about 12 microns required between light sources if the viewer wanted to only distinguish green. Smaller spacing is required for only perceiving red and larger spacing for only perceiving blue. The optics are designed and semiconductor processed for each element using appropriate masks so that a single large macroscopic element comprised of multiple microscopic elements is achieved for the multiple optics element described above.

The invention is low cost because there is very little labor involved and routine semiconductor processes are used. For example, the electronics are comprised of standard drivers and amplifiers. All elements are integrated per application requirements into an applications specific integrated circuit (ASIC). Contacts to other elements such as other chips, diodes/lasers, or sensor elements are accomplished through the atomically sharp points 1004 shown in FIG. 10. The sharp points that are integrated with part of the display ASICs are not used to provide electron emission to phosphors, but to make direct contact with other devices such as the diodes/lasers of the present invention. They can also be used to make other types of contacts such as contacts with other chips, and/or sensor elements such as GaAs, HgCdTe, and InSb. The present invention uses the sharp contacts 1004 which are integrated with the designed (per the specific application) ASICs to directly join them to a corresponding array of diodes/lasers with backside contacts. The contacts provide drive power to the diodes/lasers. The diodes/lasers can be fabricated on lift-off substrates and technology, but the present invention is not limited to such fabrication. Once the diodes/lasers-electronic arrays are accomplished, these are the joined to the optics-phosphors arrays to form the display system of the present invention.

It is important to note that while the present invention has been described in the context of a fully functioning miniature personal display device, those of ordinary skill in the art will appreciate that the methods and concepts of the present invention are capable of being applied and embodied in other embodiments and that the present invention applies equally regardless of the particular implementation actually used to exploit the benefits of the invention. Examples of other possible embodiments include virtual reality equipment, improved multi-chip connections, etc.

The description of the present invention has been presented for purposes of illustration and description, but is not intended to be exhaustive or limited to the invention in the form disclosed. Many modifications and variations will be apparent to those of ordinary skill in the art. The embodiments described were chosen in order to best explain the principles of the invention in a practical application to enable others of ordinary skill in the art to understand the invention for various embodiments with various modifications as are suited to the particular use contemplated. While the invention has been particularly shown and described with reference to preferred embodiments, it will be understood by those skilled in the art that various changes in form and detail may be made therein without departing from the spirit and scope of the invention.

We claim:

1. An apparatus for projecting an image on a retina, said apparatus comprising:
    a semiconductor package;
    a connection means integral to said semiconductor package;
    a two dimensional (m×n) array of emitters electrically connected to said semiconductor package by said connection means, wherein said emitters are a monochromatic pump source;
    an optics element attached to said two dimensional array of emitters, wherein the optics element includes a two dimensional (m×n) array of individual optical elements matched to the two dimensional array of emitters; and
    a phosphor element mounted on the apparatus between the two dimensional array of emitters and the optics element.

2. The apparatus of claim 1 wherein the emitters comprise laser diodes.

3. The apparatus of claim 1 wherein the emitters comprise surface emitting, light emitting diodes.

4. The apparatus of claim 1 wherein said connection means further comprise atomically sharp points.

5. The apparatus of claim 1 wherein said semiconductor package provides drive electronics to control and power said emitters.

6. The apparatus of claim 1 wherein said emitters produce nonvisible radiation.

7. The apparatus of claim 6 wherein the nonvisible radiation is converted to visible light by said phosphor element through a conversion process.

8. The apparatus of claim 1 wherein the optics element further comprises at least one thin film element.

9. The apparatus of claim 1 wherein the optics element further comprises:
    a lens of immersion type providing magnification and collimation;
    a second lens of Fresnel/holographic type dispersive having contoured grating and mounted to said first lens; and,
    a third lens of Fresnel/holographic grating type providing collimation and mounted to said second lens.

10. The apparatus of claim 1 wherein said phosphor element is a thin film.

11. The apparatus of claim 1 wherein said phosphor element is a thick film.

12. The apparatus of claim 1 wherein said phosphor element is mounted directly on said array of emitters.

13. The apparatus of claim 1 wherein said phosphor element is mounted directly on said optics element.

14. The apparatus of claim 1 wherein the semiconductor package, connection means, array of emitter, optics element, and phosphor element are all integrally contained in one package.

15. The apparatus of claim 1 further comprising a means for mounting the apparatus on a human head and orienting said apparatus to project an image on a retina.

16. The apparatus of claim 1 further comprising a means for selecting monitor, full video, full color, or monochromatic viewing modes.

17. A method for projecting an image on a retina comprising the steps of:
    (a) activating semiconductor drive electronics which power emitters to produce energy;
    (b) directing the produced energy at a phosphor element which converts this energy to visible light through the up-conversion process; and
    (c) focusing said visible light on a retina, wherein the emitters of step (a) are a two-dimensional array of emitters and the phosphor element of step (b) is a two-dimensional array of phosphor elements matched to the two-dimensional array of emitters and mounted between the two-dimensional array of emitters and an optical element.

18. The method of claim 17 wherein the emitters of step (a) comprise laser diodes emitting monochromatic infrared radiation.

19. The method of claim 17 wherein the phosphor element of step (b) is a two-dimensional (m×n) array of individual nonlinear optical phosphor materials.

20. A miniature personal display comprising:
    a carrier device for mounting said display on a viewer's head;
    at least one integrated semiconductor package, said package comprising drive electronics and a beam source attached to said carrier device;
    at least one integrated optics and phosphor element attached to said carrier device, wherein said package pumps energy onto said phosphor thereby producing visible light through the up-conversion process, which light is focused on the viewers eye by said optics, and wherein said beam source and said optics are matched two dimensional arrays of elements.

21. The miniature display of claim 20 wherein said display is capable of operating in either full video or monitor mode.

22. The miniature display of claim 21 wherein said display is capable of operating in full color or monochrome mode.

23. A miniature personal display apparatus for projecting an image onto an eye of a user, comprising:
    a control component;
    a two dimensional array of emitters electrically connected to the control component;
    an optics element attached to said two dimensional array of emitters, wherein the optics element contains a set of optical elements, wherein each individual optical element in the set is associated with an emitter in the two dimensional array of emitters; and
    a phosphor element mounted between the two dimensional array of emitters and the optics element.

24. The apparatus of claim 23, wherein the individual optical elements for each one of the emitters in the two-dimensional array are etched with a collimation grating.

25. The apparatus of claim 23, wherein the phosphor element includes an individual nonlinear optical phosphor material for each of the individual optical elements.

26. The apparatus of claim 25, wherein the individual nonlinear optical phosphor material is applied directly to a corresponding individual optical element of the individual optical elements.

27. The apparatus of claim 25, wherein each emitter in the array of emitters emits radiation of a same wavelength, and wherein the individual nonlinear optical phosphor material emits a different visible light from other individual nonlinear optical phosphor materials in the phosphor element based on characteristics of the individual nonlinear optical phosphor material.

28. The apparatus of claim 23, wherein each emitter in the array of emitters is capable of being randomly addressed at either monitor or full-video rates.

29. The apparatus of claim 23, wherein the two dimensional array of emitters is electrically connected to the control component by an array of atomically sharp metallic points.

30. The apparatus of claim 23, wherein each of the individual optics elements comprise:
   a first element that magnifies light passing through the first element;
   a second element that further magnifies light passing through the second element; and
   a third element that provides final collimation for input to the eye of the user.

31. The apparatus of claim 30, wherein the first element is an immersion type optical element, the second element is a Fresnel or holographic type dispersive optical element, and the third element is a Fresnel or holographic type optical element.

32. The apparatus of claim 30, wherein the first, second and third elements are thin or thick film elements.

33. The apparatus of claim 30, wherein the phosphor element is mounted to a side of the first element closest to the array of emitters.

34. The apparatus of claim 23, wherein the control component controls the two-dimensional array of emitters to emit radiation onto the phosphor element such that the phosphor element emits visible light through the optics element directly onto the eye of the user without scanning.

35. A miniature display for projecting an image onto an eye of a user, comprising:
   drive electronics;
   an array of light emitting elements; and
   an array of connectors for connecting the drive electronics to each light emitting element in the array of light emitting elements, wherein the connectors are atomically sharp metallic points and wherein the connectors touch the drive electronics and the array of light emitting elements.

36. A miniature display for projecting an image onto an eye of a user, comprising:
   drive electronics;
   an array of light emitting elements; and
   an array of connectors for connecting the drive electronics to each light emitting element in the array of light emitting elements, wherein the connectors are atomically sharp metallic points and wherein the connectors connect the drive electronics to each of the light emitting elements in the array of light emitting elements on a one-to-one basis.

37. A miniature display apparatus for projecting an image directly onto an eye of a user, comprising:
   drive electronics;
   a two-dimensional array of emitters electrically connected to the drive electronics;
   an optics element attached to the two-dimensional array of emitters; and
   a phosphor element mounted on the miniature display apparatus between the two-dimensional array of emitters and the optics element, wherein the drive electronics drive the two-dimensional array of emitters to emit radiation onto the phosphor element such that the phosphor element emits visible light through the optics element directly onto the eye of the user without scanning.

* * * * *